United States Patent
Tayebati

(10) Patent No.: US 6,744,792 B1
(45) Date of Patent: Jun. 1, 2004

(54) WAVELENGTH STABILIZATION OF TUNABLE LASERS BY CURRENT MODULATION

(75) Inventor: Parviz Tayebati, Boston, MA (US)

(73) Assignee: Nortel Networks, Ltd., St. Laurent (CA)

(*) Notice: Subject to any disclaimer, the term of this patent is extended or adjusted under 35 U.S.C. 154(b) by 0 days.

(21) Appl. No.: 09/697,198

(22) Filed: Oct. 26, 2000

Related U.S. Application Data

(60) Provisional application No. 60/161,499, filed on Oct. 26, 1999.

(51) Int. Cl.[7] .................................................. H01S 3/13
(52) U.S. Cl. ........................... 372/32; 372/20; 372/28; 372/75; 372/38.06; 372/29.011
(58) Field of Search .................... 372/32, 20, 28, 372/38.01, 38.06, 38.08, 71, 70, 75, 29.011, 31, 44

(56) References Cited

U.S. PATENT DOCUMENTS

| | | | | |
|---|---|---|---|---|
| 5,265,116 A | * | 11/1993 | Mooradian | .................. 372/21 |
| 5,450,207 A | * | 9/1995 | Fomenkov | .................. 250/226 |
| 5,657,340 A | * | 8/1997 | Camparo et al. | ........... 250/251 |
| 5,691,989 A | | 11/1997 | Rakuljic et al. | |
| 5,970,076 A | | 10/1999 | Hamada | |
| 6,014,400 A | * | 1/2000 | Kobayashi | .................. 372/96 |
| 6,018,536 A | | 1/2000 | Alphonse | |
| 6,034,799 A | | 3/2000 | Hansen | |
| 6,120,190 A | * | 9/2000 | Leard et al. | .................. 372/32 |
| 6,289,028 B1 | * | 9/2001 | Munks et al. | ................. 372/20 |

* cited by examiner

Primary Examiner—Jerome Jackson
Assistant Examiner—Matthew Landau
(74) Attorney, Agent, or Firm—John C. Gorecki

(57) ABSTRACT

Apparatus and method for stabilizing the wavelength of a tunable laser to a target wavelength, by correspondingly adjusting the electrooptical performance of the laser's gain medium, whereby to eliminate the frequency shift due to vibrational factors. The electrooptical performance of the laser's gain medium is adjusted, in the case of an electrically pumped laser, by changing the injection current used to pump the laser; and the electrical performance of the laser's gain medium is adjusted, in the case of an optically pumped laser, by changing the intensity of the pump laser used to energize the laser. The system is implemented with a feedback mechanism.

4 Claims, 3 Drawing Sheets

WAVELENGTH STABILIZATION OF TUNABLE LASERS BY CURRENT MODULATION

Reference To Pending Prior Patent Application

This patent application claims benefit of pending prior U.S. Provisional Patent Application Serial No. 60/161,499, filed Oct. 26, 1999 by Parviz Tayebati for WAVELENGTH STABILIZATION OF TUNABLE LASERS BY CURRENT MODULATION, which patent application is hereby incorporated herein by reference.

FIELD OF THE INVENTION

This invention relates to photonic devices in general, and more particularly to tunable lasers.

BACKGROUND OF THE INVENTION

In pending prior U.S. patent application Ser. No. 09/105,399, filed Jun. 26, 1998 by Parviz Tayebati et al. for MICROELECTROMECHANICALLY TUNABLE, CONFOCAL, VERTICAL CAVITY SURFACE EMITTING LASER AND FABRY-PEROT FILTER, and in pending prior U.S. patent application Ser. No. 09/543,318, filed Apr. 5, 2000 by Peidong Wang et al. for SINGLE MODE OPERATION OF MICROMECHANICALLY TUNABLE, HALF-SYMMETRIC, VERTICAL CAVITY SURFACE EMITTING LASERS, which patent applications are hereby incorporated herein by reference, there are disclosed tunable Fabry-Perot filters and tunable vertical cavity surface emitting lasers (VCSEL's).

More particularly, and looking now at FIG. 1, there is shown a tunable Fabry-Perot filter 5 formed in accordance with the aforementioned U.S. patent applications Ser. Nos. 09/105,399 and 09/543,318. Filter 5 generally comprises a substrate 10, a bottom mirror 20 mounted to the top of substrate 10, a bottom electrode 15 mounted to the top of bottom mirror 20, a thin support 25 atop bottom electrode 15, a top electrode 30 fixed to the underside of thin support 25, a reinforcer 35 fixed to the outside perimeter of thin support 25, and a confocal top mirror 40 set atop thin support 25, with an air cavity 45 being formed between bottom mirror 20 and top mirror 40.

As a result of this construction, a Fabry-Perot filter is effectively created between top mirror 40 and bottom mirror 20. Furthermore, by applying an appropriate voltage across top electrode 30 and bottom electrode 15, the position of top mirror 40 can be changed relative to bottom mirror 20, whereby to change the length of the Fabry-Perot cavity, and hence tune Fabry-Perot filter 5.

Correspondingly, and looking next at FIG. 2, a tunable vertical cavity surface emitting laser (VCSEL) 50 can be constructed by positioning a gain medium 55 between bottom mirror 20 and bottom electrode 15. As a result, when gain medium 55 is appropriately stimulated, e.g., by optical pumping or by electrical pumping, lasing can be established between top mirror 40 and bottom mirror 20. Furthermore, by applying an appropriate voltage across top electrode 30 and bottom electrode 15, the position of top mirror 40 can be changed relative to bottom mirror 20, whereby to change the length of the laser's resonant cavity, and hence tune laser 50.

The present invention is directed to tunable lasers of the type disclosed in the aforementioned U.S. patent applications Ser. Nos. 09/105,399 and 09/543,318.

Tunable lasers of the type disclosed in the aforementioned U.S. patent application Ser. Nos. 09/105,399 and 09/543,318 are highly advantageous since they can be quickly and easily tuned by simply changing the voltage applied across the top electrode and the bottom electrode.

However, it has been found that tunable lasers of the type disclosed in the aforementioned U.S. patent application Ser. Nos. 09/105,399 and 09/543,318 can suffer from vibrational problems.

The aforementioned vibrational problems may be due to a variety of factors, such as thermal noise; or noise in the tuning voltage of the laser; or, in the case of an electrically pumped laser, shot noise in the injection current; etc.

Regardless of the cause, the effect of these vibrational problems is to cause the laser to move out of tune. In other words, these vibrational effects cause the output frequency of the laser to change even though the tuning voltage of the laser is held constant. While the extent of this vibration-related frequency shift may be relatively modest (e.g., a 300 MHz shift in the lasing frequency from a 100 MHz vibration frequency), this frequency shift may nonetheless create significant problems in certain types of systems, e.g., WDM communication systems.

See, for example, FIG. 3, which schematically illustrates how the aforementioned vibrational problems may cause a relatively periodic modulation of the lasing frequency; and FIG. 4, which schematically illustrates how the aforementioned vibrational problems may cause a relatively irregular modulation of the lasing frequency.

As a result, an object of the present invention is to provide a method and apparatus for stabilizing the wavelength of tunable lasers affected by the aforementioned vibrational problems.

SUMMARY OF THE INVENTION

The present invention provides a fast and easy way to compensate for the aforementioned vibrational problems in tunable lasers, by correspondingly adjusting the electrooptical performance of the laser's gain medium, whereby to eliminate the frequency shift due to vibrational factors.

The electrooptical performance of the laser's gain medium is adjusted, in the case of an electrically pumped laser, by changing the injection current used to pump the laser; and the electrical performance of the laser's gain medium is adjusted, in the case of an optically pumped laser, by changing the intensity of the pump laser used to energize the laser.

The system is implemented with a feedback mechanism. A wavelength measuring module detects the difference between the instantaneous wavelength of the laser and the desired wavelength of the laser, and generates a voltage signal which is representative of this difference. This voltage signal is then used to appropriately modify the electrooptical performance of the laser's gain medium, either by appropriately adjusting the injection current applied to the gain medium (in the case of an electrically pumped laser), or by appropriately adjusting the intensity of the pump laser applied to the gain medium (in the case of an optically pumped laser).

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein.

DETAILED DESCRIPTION OF THE PREFERRED EMBODIMENTS

Figure 1:
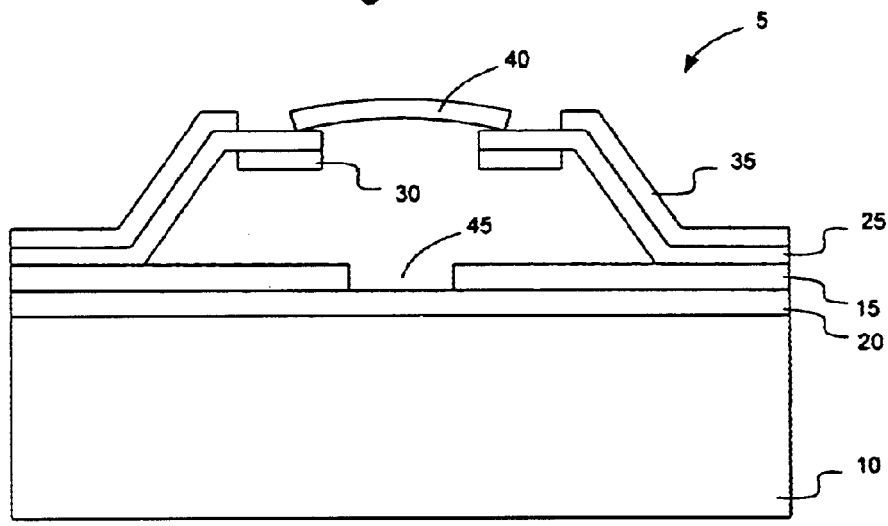
FIG. 1 is a schematic side view of a tunable Fabry-Perot filter.
Figure 2:
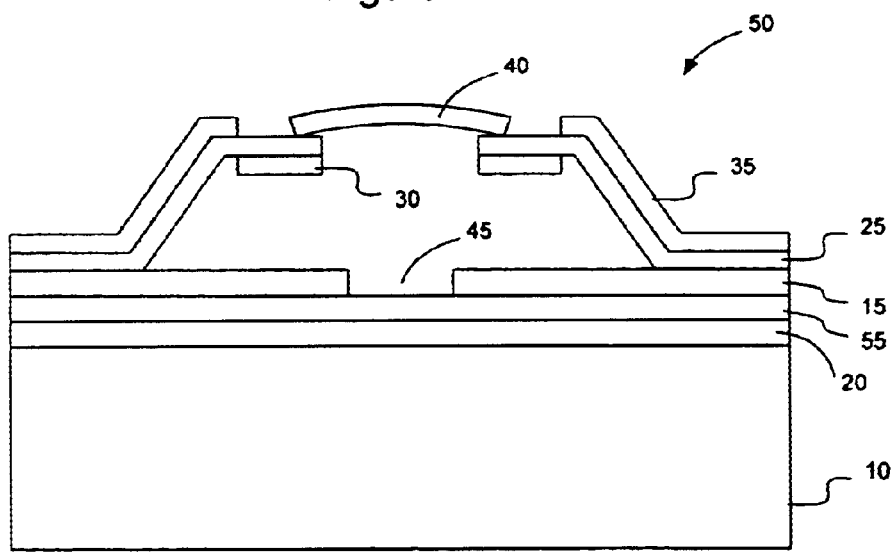
FIG. 2 is a schematic side view of a tunable VCSEL.
Figure 3:
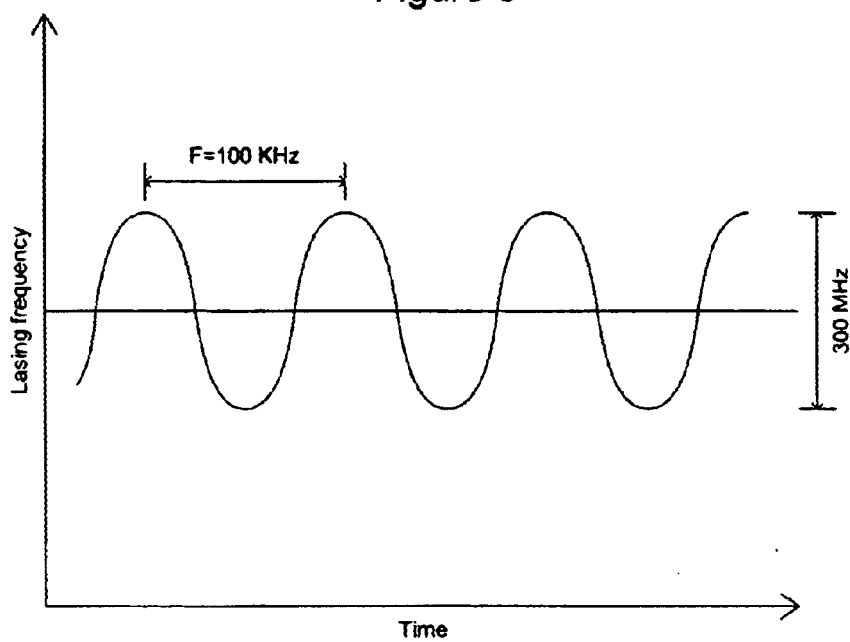
FIG. 3 is a schematic diagram illustrating how the aforementioned vibrational problems may cause a relatively periodic modulation of the lasing frequency of a laser.
Figure 4:
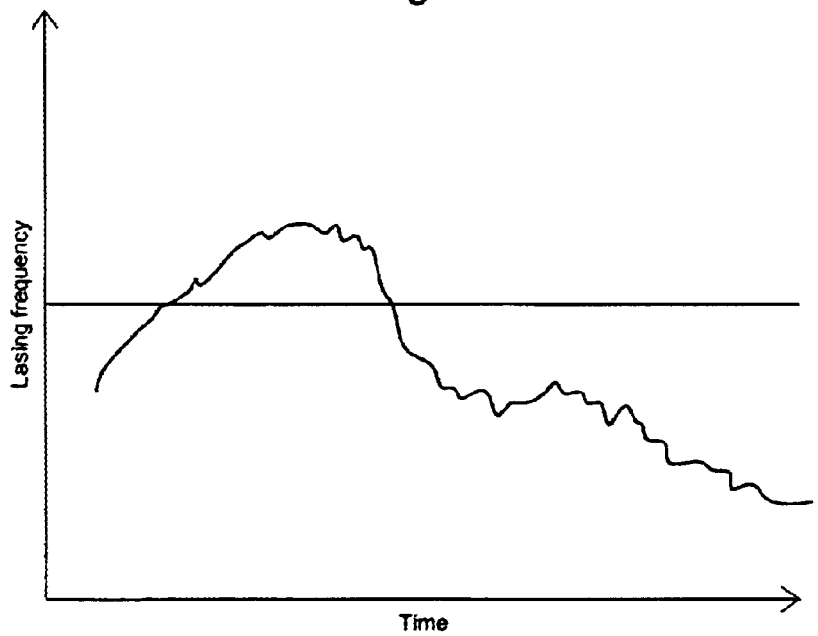
FIG. 4 is a schematic diagram illustrating how the aforementioned vibrational problems may cause a relatively irregular modulation of the lasing frequency of a laser.

The present invention provides a fast and easy way to compensate for the aforementioned vibrational problems in tunable lasers, by correspondingly adjusting the electrooptical performance of the laser's gain medium, whereby to eliminate the frequency shift due to vibrational factors.

More particularly, in a tunable laser of the sort disclosed in the aforementioned U.S. patent application Ser. Nos. 09/105,399, and 09/543,318, the output frequency of the laser may be affected by three variables, among others: (1) the tuning voltage applied to the laser, in the case of both electrically pumped and optically pumped lasers; (2) the injection current applied to the laser's gain medium, in the case of an electrically pumped laser; and (3) the intensity of the pump laser applied to the laser's gain medium, in the case of an optically pumped laser.

In particular, in the case of an electrically pumped laser, changing the injection current applied to the laser's gain medium causes a change in both the intensity of the laser's output and the output frequency of the laser. This is due to a corresponding change in the electrooptical performance of the laser's gain medium.

And in the case of an optically pumped laser, changing the intensity of the pump laser applied to the laser's gain medium causes a change in both the intensity of the laser's output and the output frequency of the laser. Again, this is due to a corresponding change in the electrooptical performance of the laser's gain medium.

The present invention is adapted to utilize one or the other of these phenomena, depending on whether the laser is electrically pumped or optically pumped, to selectively adjust the electrooptical performance of the laser's gain medium, whereby to eliminate the frequency shift due to the aforementioned vibrational factors.

More specifically, the present invention is adapted to (1) detect the frequency shift due to vibrational factors, and (2) compensate for this frequency shift by selectively modifying the electrooptical performance of the laser's gain medium, whereby to lock the laser to its target frequency. In the case of an electrically pumped laser, this compensation is achieved by appropriately adjusting the injection current applied to the laser's gain medium; in the case of an optically pumped laser, this compensation is achieved by selectively adjusting the intensity of the pump laser applied to the laser's gain medium.

The system is implemented with a feedback mechanism. More particularly, a wavelength measuring module detects the difference between the instantaneous wavelength of the tunable laser and the desired wavelength of the laser, and generates a voltage signal which is representative of this difference. This voltage signal is then used to appropriately modify the electrooptical performance of the laser's gain medium, either by appropriately adjusting the injection current applied to the gain medium (in the case of an electrically pumped laser), or by appropriately adjusting the intensity of the pump laser applied to the gain medium (in the case of an optically pumped laser).

The particular wavelength measuring module used for the feedback mechanism can be any one of the many such devices well known in the art.

Figure 5:
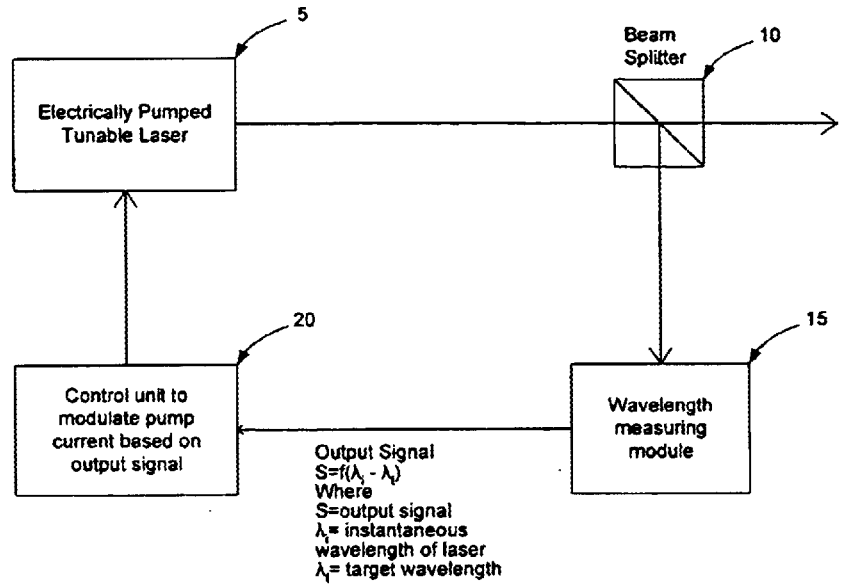
FIG. 5 is a schematic diagram of a system for stabilizing the wavelength of an electrically pumped tunable laser.

Looking now at FIG. 5, there is shown a preferred system for stabilizing the wavelength of an electrically pumped tunable laser 5. More particularly, the output of laser 5 is passed to a beamsplitter 10, where a portion of the laser's output is directed to a wavelength measuring module 15. Wavelength measuring module 15 is adapted to generate an output signal which is a function of the difference between the instantaneous wavelength of the tunable laser and the target wavelength of the laser. Preferably this output signal is in the form of a voltage signal whose magnitude varies according to the difference between the instantaneous wavelength of the tunable laser and the target wavelength of the laser. The output signal from wavelength measuring module 15 is then fed to a control unit 20, which modulates the pump current applied to tunable laser 5 according to the output signal of wavelength measuring module 15, whereby to keep tunable laser 5 locked to its target frequency.

Figure 6:
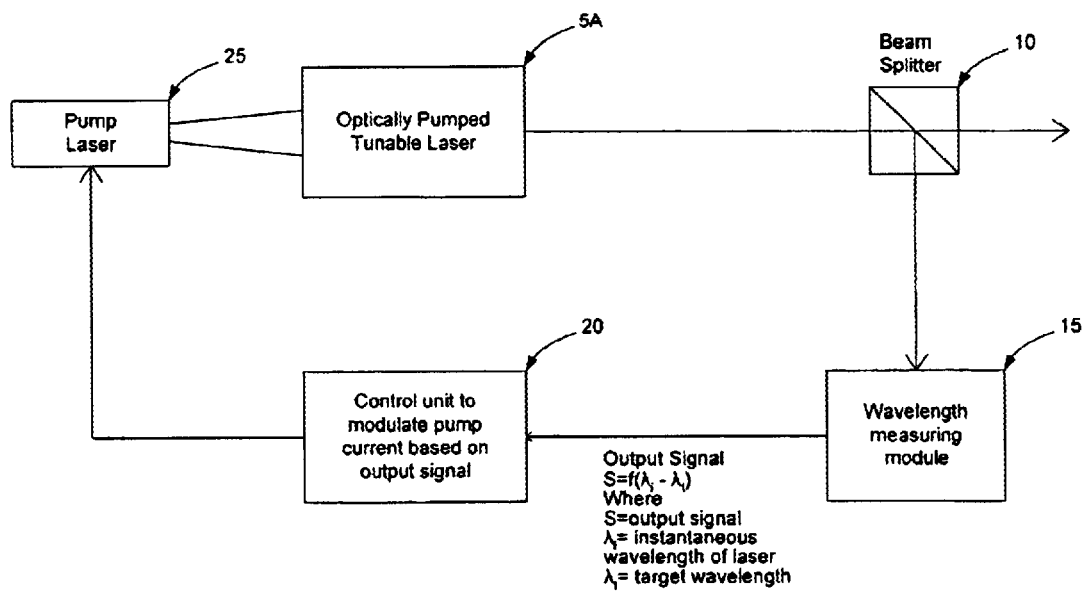
FIG. 6 is a schematic diagram of a system for stabilizing the wavelength of an optically pumped tunable laser.

Correspondingly, and looking now at FIG. 6, there is shown a preferred system for stabilizing the wavelength of an optically pumped laser 5A. More particularly, the output of laser 5A is passed to a beamsplitter 10, where a portion of the laser's output is directed to a wavelength measuring module 15. Wavelength measuring module 15 is adapted to generate an output signal which is a function of the difference between the instantaneous wavelength of the tunable laser and the target wavelength of the laser. Preferably this output signal is in the form of a voltage signal whose magnitude varies according to the difference between the instantaneous wavelength of the tunable laser and the target wavelength of the laser. The output signal from wavelength measuring module 15 is then fed to a control unit 20, which modulates the pump current of a pump laser 25 according to the output signal of wavelength measuring module 15, whereby to keep the tunable laser locked to its target frequency.

It is to be understood that the present invention is by no means limited to the particular constructions and method steps disclosed above and/or shown in the drawings, but also comprises any modifications or equivalents within the scope of the claims.

What is claimed is:

1. Wavelength stabilizing apparatus for use in stabilizing the wavelength of an optically pumped tunable laser to a predetermined target wavelength, wherein the optically pumped tunable laser provides an output laser signal having an instantaneous wavelength and the optically pumped tunable laser is optically pumped by a pump laser signal provided by a pump laser, the pump laser signal having an intensity, the pump laser and the optically pumped tunable laser each having a gain medium and each gain medium having an electrooptical performance characteristic, the wavelength stabilizing apparatus comprising:

a wavelength measuring module for detecting a difference between the instantaneous wavelength of the output laser signal and the predetermined target wavelength, and for generating an output error signal which is representative of the difference; and a control unit for receiving said output error signal from said wavelength measuring module and for providing a control signal to said pump laser suitable for modifying the electrooptical performance characteristic of said the medium of the pump laser in accordance with said control signal, wherein the modified electrooptical performance characteristic of the gain medium modulates the intensity of said pump laser signal, wherein the modulated pump laser signal modifies the electrooptical performance characteristic of the gain medium of the optically pumped tunable laser, wherein the wavelength of the output laser signal of the optically pumped tunable laser is adjusted to substantially equal the predetermined target wavelength.

2. Wavelength stabilizing apparatus according to claim 1 wherein the pump laser is an electrically pumped laser having an injection current and wherein the control unit is adapted to adjust the injection current applied to the gain medium, wherein adjustments to the injection current modify the electrooptical performance characteristic of the gain medium of the pump laser and thereby modify the intensity of the pump laser signal and thereby modify the electrooptical performance of the gain medium of the optically pumped tunable laser.

3. A laser system comprising:
an optically pumped tunable laser;
a pump laser providing a pump laser signal having an intensity, said pump laser having a gain medium, the gain medium having an electrooptical characteristic, said pump laser signal being optically coupled to the optically pumped tunable laser, wherein the optically pumped tunable laser provides a laser output signal having a wavelength;
wavelength stabilizing apparatus for use in stabilizing the wavelength of the laser output signal to a target wavelength, said wavelength stabilizing apparatus comprising:

a wavelength measuring module for detecting a difference between an instantaneous wavelength of the laser output signal and the target wavelength, and for generating an error signal which is representative of the difference; and
a control unit for receiving said error signal from said wavelength measuring module and operative to provide a control signal to the pump laser suitable for modifying said electrooptical characteristic of the gain medium of the pump laser in accordance with said control signal, wherein the modified electrooptical performance characteristic of the gain medium of the pump laser modulates the intensity of the pump laser signal, wherein said modulated pump laser signal modifies the electrooptical performance characteristic of the gain medium of the optically pumped tunable laser, so as to adjust the tunable laser to its target wavelength.

4. A method for stabilizing the wavelength of an optically pumped tunable laser to a target wavelength, said method comprising:
determining a target wavelength of a laser signal emitted from the optically pumped tunable laser from a range of wavelengths corresponding to a tuning voltage applied across a top electrode and a bottom electrode of the tunable laser;
detecting a difference between an instantaneous wavelength of the laser and the target wavelength and generating an output signal which is representative of the difference; and
modifying an electrooptical performance characteristic of a gain medium of a pump laser providing a pump laser signal to the optically pumped tunable laser in accordance with said output signal so as to adjust the laser signal from the tunable laser to the predetermined target wavelength.

* * * * *